United States Patent [19]

Gorecki

[11] Patent Number: 5,084,634

[45] Date of Patent: Jan. 28, 1992

[54] DYNAMIC INPUT SAMPLING SWITCH FOR CDACS

[75] Inventor: James L. Gorecki, Vail, Ariz.

[73] Assignee: Burr-Brown Corporation, Tucson, Ariz.

[21] Appl. No.: 602,705

[22] Filed: Oct. 24, 1990

[51] Int. Cl.$^5$ ............... H03K 5/59; H03K 17/687; H03K 17/56; G06G 7/12

[52] U.S. Cl. ................... 307/352; 307/353; 307/491; 307/572; 307/246

[58] Field of Search ............... 307/352, 353, 491, 572, 307/246

[56] References Cited

U.S. PATENT DOCUMENTS

| | | | |
|---|---|---|---|
| 3,983,414 | 9/1976 | Stafford et al. | 307/251 |
| 4,449,066 | 5/1984 | Aoyama et al. | 307/482 |
| 4,511,814 | 4/1985 | Matsuo et al. | 307/572 |
| 4,590,396 | 5/1986 | Koike | 307/572 |
| 4,595,845 | 6/1986 | Briggs | 307/443 |
| 4,651,037 | 3/1987 | Ogasawara et al. | 307/572 |
| 4,656,429 | 4/1987 | Masuda et al. | 328/149 |
| 4,804,870 | 2/1989 | Mahmud | 307/482 |

FOREIGN PATENT DOCUMENTS

| | | |
|---|---|---|
| 0020160 | 12/1980 | European Pat. Off. |
| 0231915 | 12/1984 | Japan |
| 0050208 | 3/1988 | Japan |
| 1274147 | 11/1986 | U.S.S.R. |

Primary Examiner—Eugene R. LaRoche
Assistant Examiner—Michael B. Shingleton
Attorney, Agent, or Firm—Cahill, Sutton & Thomas

[57] ABSTRACT

A low distortion capacitor sampling circuit includes a sampling MOSFET, the source electrode of which receives a time-varying input voltage to be sampled. A bootstrap capacitor has a first terminal connected to the gate electrode of the sampling MOSFET and to a first MOSFET that charges the first terminal of the bootstrap capacitor to a first voltage in response to a first control signal. A delayed second control signal is applied to the gate of a second MOSFET the drain electrode of which is connected to a second terminal of the bootstrap capacitor to keep the pulldown MOSFET on until the charging of the sampling capacitor is complete. Then a third control signal turns on a third MOSFET, boosting both terminals of the bootstrap capacitor. The second control signal then turns the third MOSFET off, electrically isolating the gate electrode of the sampling MOSFET. Changes in the time-varying input voltage are coupled by the gate-to-source capacitance of the sampling MOSFET to the gate electrode thereof. The input voltage is simultaneously applied to a source follower circuit, the output of which is coupled by a CMOS transmission gate to the body electrode of the sampling MOSFET. The circuit avoids harmonic distortion due to modulation of channel resistance of the sampling MOSFET by keeping the gate-to-source voltage and the source-to-body electrode voltage independent of the input voltage.

11 Claims, 1 Drawing Sheet

DYNAMIC INPUT SAMPLING SWITCH FOR CDACS

BACKGROUND OF THE INVENTION

The invention relates to MOSFET sampling switches, and particularly to an improved MOSFET sampling switch that produces a constant channel resistance $R_{DS}$ and thereby avoids producing distortion of the signal being sampled.

FIG. 2 shows a conventional analog sampling switch that includes an N channel MOSFET 3 having its gate electrode connected to +V, its source connected by conductor 2 to receive an analog input voltage $V_{IN}$, and its drain connected by sampling capacitor 5 to a conductor 7. Conductor 7 is connected to circuitry that utilizes the sampled voltage. N channel MOSFET 6 is a "grounding transistor" that grounds one plate of the sampling capacitor 5 as it is being charged to $V_{IN}$ through sampling MOSFET 3. The bulk electrode of MOSFET 3 is connected to −V volts. A problem with the circuit of FIG. 2 is that the gate-to-source threshold voltage (which partially determines the channel resistance $R_{DS}$ of MOSFET 3) is quite low, typically only a few volts. The gate-to-source voltage varies considerably as $V_{IN}$ varies between +5 volts and −5 volts. This gate-to-source voltage variation causes a varying channel resistance of sampling MOSFET 3. Furthermore, the threshold voltage $V_{TN}$ of MOSFET 3 is a strong function of the voltage between its source electrode and its body electrode. The source-to-bulk voltage varies considerably as $V_{IN}$ varies, producing further changes in the channel resistance of sampling MOSFET 3 as a function of the input voltage $V_{IN}$. Consequently, a considerable amount of harmonic distortion is produced in the sampled version of $V_{IN}$ that is stored on sampling capacitor 5 by charging it through the channel resistance $R_{DS}$ of sampling MOSFET 3. Consequently, if conductor 7 is connected to the capacitor array of a CDAC (Capacitor Digital-to-Analog Converter), the harmonic distortion produces errors in the digital output voltage produced by the CDAC to represent the time-varying analog input voltage $V_{IN}$. Conventional CMOS "transmission gates" produce harmonic distortion in an entirely similar fashion.

SUMMARY OF THE INVENTION

Accordingly, it is an object of the invention to provide a MOSFET sampling device that avoids introducing harmonic distortion into a sampled representation of an analog input voltage.

It is another object of the invention to provide a MOSFET sampling device that maintains its channel resistance substantially constant during variations in the analog input voltage being sampled.

It is another object of the invention to provide an analog sampling switch for a CDAC that reduces harmonic distortion.

Briefly described, and in accordance with one embodiment thereof, the invention provides a low distortion voltage sampling circuit including a sampling MOSFET, the source electrode of which receives a time-varying input voltage to be sampled. A sampling capacitor has a first terminal connected to the drain electrode of the sampling MOSFET and a second terminal connected to the drain electrode of a grounding MOSFET. A bootstrap capacitor has a first terminal connected to the gate electrode of the sampling MOSFET and to a first MOSFET which charges the first terminal of the bootstrap capacitor and the gate electrode of the sampling MOSFET to a first voltage. The first MOSFET charges up the first terminal of the bootstrap capacitor and the gate electrode of the sampling MOSFET in response to a first control signal. A second control signal delayed relative to the first is applied to the gate of a second MOSFET the drain electrode of which is connected to a second terminal of the bootstrap capacitor. The delayed control signal keeps the second MOSFET on until the charging of the gate electrode of the sampling MOSFET and the first terminal of the sampling capacitor are complete. Then a second control signal turns on a third MOSFET, boosting the first and second terminals of the bootstrap capacitor. The second control signal is removed from the base of the third MOSFET, electrically isolating the gate electrode of the sampling MOSFET. Changes in the time-varying input voltage are coupled by the gate-to-source capacitance of the sampling MOSFET to the gate electrode thereof. The input voltage is simultaneously applied to a source follower circuit, the output of which is coupled by a CMOS transmission gate to the body electrode of the sampling MOSFET, whereby the body effect of the sampling MOSFET is kept constant. The described circuit avoids harmonic distortion due to modulation of channel resistance of the sampling MOSFET by keeping the gate-to-source voltage and the source-to-body electrode voltage substantially independent of the input voltage.

DETAILED DESCRIPTION OF THE PREFERRED EMBODIMENT

Figure 1:
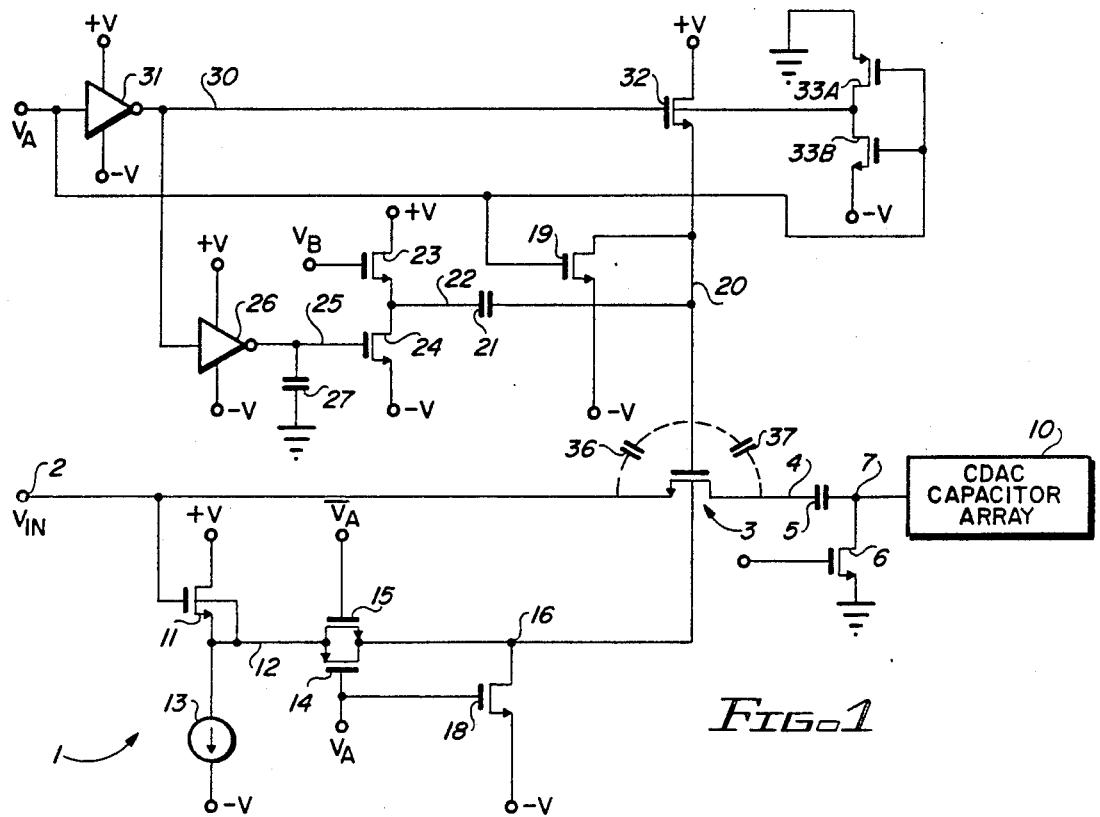
FIG. 1 is a circuit diagram of the MOSFET sampling switch of the present invention.
Figure 2:
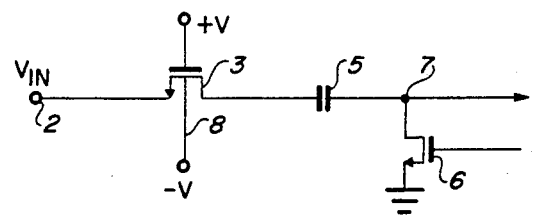
FIG. 2 is a circuit schematic diagram of a conventional MOSFET sampling switch.

Referring now to FIG. 1, voltage sampling circuit 1 includes an input conductor 2 receiving a time-varying analog input voltage $V_{IN}$. $V_{IN}$ is connected to the source electrode of N channel sampling MOSFET 3. (Those skilled in the art will recognize that the "source" electrode is arbitrarily assigned in FIG. 1; the source and drain designations of electrodes of a MOSFET are interchangeable, the one at the highest voltage for an N channel MOSFET (and the lowest voltage for a P channel MOSFET) functioning as the source and the other functioning as the drain.) The drain electrode of sampling MOSFET 3 is connected by conductor 4 to one plate of a sampling capacitor 5, the other plate of which is connected by conductor 7 to the drain electrode of an N channel grounding MOSFET 6 and also to an input of a utilization circuit such as a CDAC capacitor array 10.

The body or bulk electrode of sampling MOSFET 3 is connected by conductor 16 to one terminal of a CMOS transmission gate including P channel MOSFET 14 and N channel MOSFET 15. The other terminal of the CMOS transmission gate 14,15 is connected by conductor 12 to the source electrode and body electrode of an N channel source follower MOSFET 11, the drain electrode of which is connected to +V. The gate of MOSFET 11 is connected to conductor 2. A current source 13 connected to conductor 12 determines the source current of source follower MOSFET 11.

Figure 3:
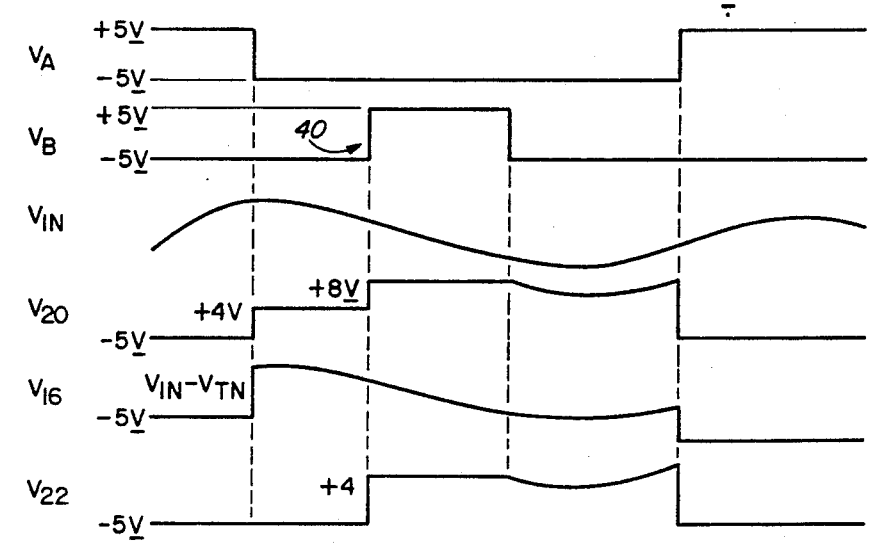
FIG. 3 is a timing diagram useful in describing the operation of the circuit of FIG. 1.

A voltage signal $V_A$, the waveform of which is shown in FIG. 3, is applied to the gate electrode of P channel transmission gate MOSFET 14, and also to the gate electrode of N channel MOSFET 18, the source of which is connected to $-V$ and the drain of which is connected to conductor 16. The complement of $V_A$, namely $\overline{V}_A$, is applied to the gate electrode of N channel transmission gate MOSFET 15.

The gate electrode of sampling MOSFET 3 is connected by conductor 20 to one plate of a 2.0 picofarad bootstrap capacitor 21, the other plate of which is connected by conductor 22 to the source of N channel MOSFET 23 and the drain of N channel MOSFET 24. The gate of MOSFET 23 is connected to receive a second control signal $V_B$, and waveform of which is shown in FIG. 3, and the drain of MOSFET 23 is connected to $+V$. The gate electrode of MOSFET 24 is connected by conductor 25 to the output of a CMOS inverter 26 and to one plate of 1.2 picofarad capacitor 27, the other plate of which is connected to ground. The source electrode of MOSFET 24 is connected to $-V$.

The input of inverter 26 is connected by conductor 30 to the output of CMOS inverter 31. The input of CMOS inverter 31 is connected to receive the signal $V_A$, which also is applied to the input of CMOS inverter 33A,B. CMOS inverter 33A,B includes an N channel MOSFET 33B having its source connected to $-V$ and its drain connected to the drain electrode of P channel MOSFET 33A. The source of MOSFET 33A is connected to ground, rather than $+V$. The drains of the pullup MOSFETs of CMOS inverters 26 and 31 are connected to $+V$, as indicated by the inverter symbols therefore and FIG. 1.

Conductor 30 is connected to the gate electrode of N channel source follower MOSFET 32, the drain of which is connected to $+V$ and the source of which is connected to conductor 20. The body electrode of MOSFET 32 is connected to the output of inverter 33A,B.

For purposes of the following discussion of the operation of the sampling circuit 1, it is assumed that $+V$ is equal to $+5$ volts and that $-V$ is equal to $-5$ volts. Initially, when circuit 1 is in its non-sampling mode, $V_A$ is at $+5$ volts and $V_B$ is at $-5$ volts, as shown in FIG. 3. MOSFET 18 is on, and the body electrode (i.e., P well electrode) of MOSFET 3 is at $-V$ volts. During the non-sampling mode it is desirable that the body electrode of sampling MOSFET 3 be at $-V$ volts to prevent forward biasing of the source-to-bulk diode.

The voltage on conductor 30 initially is $-V$ volts, and MOSFET 32 is off. Its body electrode voltage, connected to the output of inverter 33A,B, also is at $-V$ volts. MOSFET 23 initially is off, since $V_B$ is at $-V$ volts. MOSFET 24 is on, electrically connecting conductor 22 to $-V$.

The first thing that happens during a sampling operation is that $V_A$ undergoes transition 39 (FIG. 3) from $+5$ volts to $-5$ volts. The capacitance $C_2$ of capacitor 27, which is about 1.2 picofarads, in conjunction with the resistance of a pulldown MOSFET internal to inverter 26, produces a delay of approximately 30 nanoseconds before MOSFET 24 turns off. During this delay time the voltage on conductor 30 rises to $+V$ volts, turning on MOSFET 32. MOSFET 19 is turned off, after previously having been held on and holding conductor 20 at $-V$ volts while $V_A$ was at $+5$ volts.

Conductor 20 then is pulled up to within one threshold voltage of $+V$ volts. The threshold voltage of MOSFET 32 is assumed to be one volt. Since $+V$ is 5 volts, the voltage in conductor 20 rapidly rises to $+4$ volts, charging capacitor 21 and the gate of sampling MOSFET 3 to $+4$ volts during the delay produced by inverter 26 and capacitor 27. MOSFET 24 then is turned off, allowing conductor 22 to electrically "float".

Transmission gate MOSFETs 14 and 15 turn on when $V_A$ goes to zero, and MOSFET 18 turns off. The voltage on conductor 12 then is at $V_{IN}$ minus the threshold voltage $V_{IN}$ of source follower MOSFET 11, and this voltage is applied directly to the P well conductor 16, thereby maintaining a constant source-to-body voltage on sampling MOSFET 3.

Next, $V_B$ undergoes transition 40 (FIG. 3) from $-5$ volts to $+5$ volts, turning on MOSFET 23. This causes conductor 22 and the connected plate of bootstrap capacitor 21 to rise from ground to $+5$ volts minus the one volt threshold voltage of MOSFET 23, i.e., to approximately $+4$ volts. This causes the voltage on conductor 20 to be boosted from $+4$ volts to approximately $+8$ volts, turning MOSFET 32 completely off. Next, $V_B$ undergoes transition 41 from $+V$ volts to $-V$ volts, turning MOSFET 23 off. Conductor 22 then again is electrically floating. Therefore, conductor 20 also is electrically floating.

Then, any changes in $V_{IN}$ are capacitively coupled by gate-to-source capacitance $C_{GS}$ from conductor 2 to conductor 20, since there is no place else for the charge to flow. Therefore, the gate-to-source capacitance of sampling MOSFET 3 remains constant despite variations in $V_{IN}$. Sampling capacitor 5 therefore is charged by the current flowing from $V_{IN}$ through the source, channel resistance, and drain of sampling MOSFET 3, assuming that MOSFET 6 is being held in the on condition by a utilization circuit (not shown) such as one associated with CDAC capacitor array 10 or such as a switched capacitor integrator.

Thus, the voltage sampling circuit of FIG. 1 keeps the channel resistance $R_{DS}$ of sampling MOSFET 3 constant by maintaining both $V_{GS}$ and $V_{SB}$ constant during input voltage sampling operations despite variations of $V_{IN}$. Harmonic distortion in the representations of $V_{IN}$ stored on sampling capacitor 5 thereby are greatly reduced.

The waveforms of $V_{IN}$, and the voltages $V_{20}$, $V_{16}$, and $V_{22}$ appearing on conductors 20, 16, and 22, respectively, are shown in FIG. 3.

Note that the large 2.0 picofarad value of bootstrap capacitor 21 necessary to ensure that capacitive voltage division does not occur across capacitor 21 and an equivalent capacitance consisting of parasitic capacitances 36 and 37 of sampling MOSFET 3 as MOSFET 23 raises the voltage on conductor 22 from ground to approximately $+4$ volts. This ensures the highest level on conductor 20 and the lowest channel resistance $R_{DS}$ of MOSFET 3 during sampling.

The reason for connecting the body electrode of MOSFET 32 to the output of inverter 33A,B is to reduce the reverse bias voltage across a diode consisting of the N type source electrode of MOSFET 32 and the P type well region in which it is formed when the voltage on node 20 is raised to approximately $+8$ volts. This reverse bias voltage would be 13 volts, which is too close to the source-to-body reverse breakdown voltage to be permissible.

While the invention has been described with reference to several particular embodiments thereof, those skilled in the art will be able to make the various modifications to the described embodiments of the invention without departing from the true spirit and scope of the invention. It is intended that all combinations of elements and steps which perform substantially the same function in substantially the same way to achieve the same result are within the scope of the invention. For example, the signal on conductor 25 which keeps MOSFET 24 on until capacitor 21 is charged by MOSFET 32 can be supplied by circuitry other than inverter 26 and capacitor 27. Furthermore, various other unity gain circuits then source follower 11,13 can be utilized to maintain the source-to-body voltage of MOSFET 3 constant during sampling.

What is claimed is:

1. A low distortion circuit for sampling an input voltage, comprising in combination:
   (a) a sampling MOSFET having source, drain, gate, and body electrodes, the source electrode receiving the input voltage;
   (b) a sampling capacitor having a first terminal coupled to the drain electrode and a second terminal connected to a grounding MOSFET;
   (c) a bootstrap capacitor having a first terminal coupled by a first conductor to the gate electrode of the sampling MOSFET;
   (d) first means coupled by the first conductor to the gate electrode of the sampling MOSFET for charging the first terminal of the bootstrap capacitor and the gate electrode to a first voltage, the first means producing a high impedance condition on the first conductor when the first voltage is attained;
   (e) second means coupled to the second terminal of the bootstrap capacitor for applying a second voltage to the second terminal of the bootstrap capacitor during the charging of the first terminal of the bootstrap capacitor;
   (f) third means for applying a third voltage to the second terminal of the bootstrap capacitor to produce a voltage on the first conductor equal to the first voltage plus the difference between the third and second voltages, and then producing a high impedance condition on the second terminal of the bootstrap capacitor, changes of the input voltage being capacitively coupled onto the first conductor by means of a gate-to-source capacitance of the sampling MOSFET; and
   (g) a unity gain buffer having an input coupled to the input voltage and an output coupled to the body electrode of the sampling MOSFET,
whereby the gate-to-source voltage and the source-to-body voltage of the sampling MOSFET, and hence the channel resistance of the sampling MOSFET, are substantially independent of the changes of the input voltage.

2. The low distortion circuit of claim 1 wherein the first means includes a first MOSFET having a gate electrode coupled to a first control signal and a source electrode coupled to the first conductor.

3. The low distortion circuit of claim 2 wherein the first means includes a first CMOS inverter having an input coupled to the first control signal and an output coupled to the gate electrode of the first MOSFET.

4. The low distortion circuit of claim 3 wherein the first means includes a second CMOS inverter having an input coupled to the first control voltage and an output coupled to a body electrode of the first MOSFET, the second CMOS inverter including a P channel pullup MOSFET having a source electrode coupled to a ground conductor.

5. The low distortion circuit of claim 2 wherein the second means includes a second MOSFET having a source electrode coupled to a first supply voltage conductor, a drain electrode coupled to the second terminal of the bootstrap capacitor, and a gate electrode coupled to a signal delayed with respect to the first control signal to turn the second MOSFET off after the first conductor has been charged to the first voltage.

6. The low distortion circuit of claim 5 wherein the third means includes a third MOSFET having a source coupled to the second terminal of the bootstrap capacitor and a gate electrode coupled to a second control signal that occurs after the delayed signal to apply the third voltage to the second terminal of the bootstrap capacitor, the third control signal turning the third MOSFET off after the third voltage has been attained.

7. The low distortion circuit of claim 1 wherein the unity gain buffer includes a source follower MOSFET having a gate electrode coupled to the input voltage and a source electrode coupled to the body electrode of the sampling MOSFET.

8. The low distortion circuit of claim 7 wherein the source of the source follower MOSFET is coupled to the body electrode of the sampling MOSFET by means of a CMOS transmission gate controlled by the first control signal, wherein the low distortion circuit includes a MOSFET having a gate electrode coupled to the first control signal, a source electrode coupled to a supply voltage conductor, and a drain electrode coupled to the body electrode of the sampling MOSFET.

9. A low distortion method of sampling an input voltage, comprising the steps of:
   (a) applying the input voltage to a source electrode of a sampling MOSFET and to an input of a unity gain buffer;
   (b) applying an output signal produced by the unity gain buffer to a body electrode of the sampling MOSFET;
   (c) applying a first control signal to a gate electrode of a first MOSFET having a source electrode coupled to a gate electrode of the sampling MOSFET and a first terminal of a bootstrap capacitor to charge the gate electrode of the sampling MOSFET and the first terminal to a first voltage;
   (d) applying a voltage to a gate electrode of a second MOSFET having a source electrode coupled to a supply voltage conductor to maintain the second MOSFET in an on condition during step (c) and then applying another voltage to the gate electrode of the second MOSFET to turn it off after the first voltage has been attained;
   (e) applying a third control voltage to a gate electrode of a third MOSFET having a source electrode coupled to the second terminal of the bootstrap capacitor to increase the voltage of the second terminal of the bootstrap capacitor by a second voltage to thereby boost the voltage of the gate electrode of the sampling MOSFET, and then removing the third control voltage to turn the third MOSFET off; and
   (f) coupling changes of the input voltage onto the gate electrode of the sampling MOSFET by means of a gate-to-source capacitance of the sampling MOSFET, whereby the gate-to-source voltage and the source-to-body voltage of the sampling MOSFET remain substantially constant and the channel resistance of the sampling MOSFET substantially independent of the input voltage.

10. The method of claim 9 including charging a sampling capacitor to the input voltage through the source and drain electrodes of the sampling MOSFET and a first terminal of the sampling capacitor while supplying a reference voltage to a second terminal of the sampling capacitor.

11. The method of claim 10 including applying the output voltage produced by the unity gain buffer through a CMOS transmission gate in response to the first control signal.

* * * * *